United States Patent
Nagaya et al.

(10) Patent No.: US 9,746,595 B2
(45) Date of Patent: *Aug. 29, 2017

(54) SOLID-STATE IMAGE CAPTURE ELEMENT OPTICAL FILTER AND APPLICATION THEREOF

(71) Applicant: JSR CORPORATION, Minato-ku (JP)

(72) Inventors: Katsuya Nagaya, Minato-ku (JP); Yukie Tanaka, Minato-ku (JP); Hiroyuki Kishida, Minato-ku (JP); Ran Mitsuboshi, Minato-ku (JP)

(73) Assignee: JSR CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/410,466

(22) PCT Filed: Jun. 20, 2013

(86) PCT No.: PCT/JP2013/066936
§ 371 (c)(1),
(2) Date: Dec. 22, 2014

(87) PCT Pub. No.: WO2014/002864
PCT Pub. Date: Jan. 3, 2014

(65) Prior Publication Data
US 2015/0285971 A1    Oct. 8, 2015

(30) Foreign Application Priority Data

Jun. 25, 2012    (JP) .................................. 2012-141770

(51) Int. Cl.
*G02B 1/04* (2006.01)
*G02B 5/22* (2006.01)
(Continued)

(52) U.S. Cl.
CPC ............. *G02B 5/208* (2013.01); *G02B 5/223* (2013.01); *G02B 5/282* (2013.01); *G03B 11/00* (2013.01);
(Continued)

(58) Field of Classification Search
None
See application file for complete search history.

(56) References Cited

U.S. PATENT DOCUMENTS 4,857,431 A    8/1989    Kato et al.
5,296,519 A    3/1994    Otsuka
(Continued)

FOREIGN PATENT DOCUMENTS

CN    101120272 A    2/2008
CN    102262254 A    11/2011
(Continued)

OTHER PUBLICATIONS

Combined Office Action and Search Report issued Mar. 4, 2016 in Chinese Patent Application No. 201380030325.8 (with English translation of Categories of Cited Documents).
(Continued)

*Primary Examiner* — Ramsey Zacharia
(74) *Attorney, Agent, or Firm* — Oblon, McClelland, Maier & Neustadt, L.L.P.

(57) ABSTRACT

An object of the present invention is to provide a solid-state image capture element optical filter having excellent visible light transmission characteristics with reduced incidence angle dependence even in the near-ultraviolet wavelength region, in which the defects of conventional optical filters such as near-infrared cut filters are improved; and a device comprising the optical filter. The solid-state image capture element optical filter of the present invention comprises: a transparent resin substrate comprising a compound (X)
(Continued)

having an absorption maximum in a wavelength range of 300 to 420 nm and a compound (Y) having an absorption maximum in a wavelength range of 600 to 800 nm; and a near infrared-reflecting film on at least one side of the substrate.

6 Claims, 3 Drawing Sheets

(51) Int. Cl.
    *G02B 5/26* (2006.01)
    *G03B 11/00* (2006.01)
    *G02B 5/20* (2006.01)
    *H01L 27/146* (2006.01)
    *H04N 5/225* (2006.01)
    *G02B 5/28* (2006.01)

(52) U.S. Cl.
    CPC ..... *H01L 27/14621* (2013.01); *H04N 5/2254* (2013.01); *G02B 1/04* (2013.01)

(56) References Cited

U.S. PATENT DOCUMENTS

| | | | |
|---|---|---|---|
| 5,401,438 | A | 3/1995 | Otsuka |
| 5,523,027 | A | 6/1996 | Otsuka |
| 6,020,490 | A | 2/2000 | Reinehr et al. |
| 2003/0197947 | A1 | 10/2003 | Obama et al. |
| 2004/0137367 | A1 | 7/2004 | Kitayama et al. |
| 2005/0068433 | A1 | 3/2005 | Aotsuka |
| 2005/0224703 | A1 | 10/2005 | Harada et al. |
| 2009/0009899 | A1 | 1/2009 | Nakamaru et al. |
| 2009/0201578 | A1 | 8/2009 | McClatchie |
| 2010/0324181 | A1 | 12/2010 | Amasaki |
| 2013/0128361 | A1 | 5/2013 | Okaniwa et al. |
| 2014/0264202 | A1* | 9/2014 | Nagaya .................. G02B 5/208 252/587 |

FOREIGN PATENT DOCUMENTS

| | | | |
|---|---|---|---|
| JP | 60-228448 | | 11/1985 |
| JP | 63-124054 | | 5/1988 |
| JP | 1-146846 | | 6/1989 |
| JP | 1-228960 | | 9/1989 |
| JP | 6-200113 | | 7/1994 |
| JP | 2846091 | B2 | 1/1999 |
| JP | 2864475 | B2 | 3/1999 |
| JP | 3366697 | B2 | 1/2003 |
| JP | 2005-109196 | | 4/2005 |
| JP | 3699464 | B2 | 9/2005 |
| JP | 3703869 | B2 | 10/2005 |
| JP | 2006-523955 | A | 10/2006 |
| JP | 2007-169315 | | 7/2007 |
| JP | 2008-1544 | | 1/2008 |
| JP | 2008-020526 | A | 1/2008 |
| JP | 4081149 | B2 | 4/2008 |
| JP | 2008-159856 | | 7/2008 |
| JP | 2009-108267 | | 5/2009 |
| JP | 2010-097062 | A | 4/2010 |
| JP | 2010-241873 | | 10/2010 |
| JP | 2011-6517 | | 1/2011 |
| JP | 4740631 | B2 | 8/2011 |
| JP | 2012-8532 | | 1/2012 |
| JP | 2012-14043 | | 1/2012 |
| JP | 2012-185468 | | 9/2012 |
| JP | WO 2013054864 | A1 * | 4/2013 ............. G02B 5/208 |
| JP | 2013-190553 | A | 9/2013 |
| TW | 201211125 | A1 | 3/2012 |
| WO | WO 2012/017848 | A1 | 2/2012 |

OTHER PUBLICATIONS

International Search Report issued Aug. 27, 2013 in corresponding PCT/JP2013/066936.
"Phthalocyanine: Its Chemistry and Functions" (Industrial Publishing & Consulting, Inc., 1997, 42 pages (with part of English translation).
Office Action issued Sep. 6, 2016 in Japanese Patent Application No. 2014-522576 with unedited computer generated English translation.
Combined Office Action and Search Report issued Aug. 24, 2016 in Chinese Patent Application No. 201380030325.8 with unedited computer generated English translation.
Office Action dated Aug. 30. 2016 in Taiwanese Patent Application No. 102122054 with English translation.
Japanese Office Action dated Apr. 4, 2017 in corr. Japanese Patent Application No. 2014-522576(w/ machine-translated English translation).
Taiwanese Office Action dated Jun. 15, 2017 in corr. Taiwanese Patent Application No. 102122054, filed Jun. 21, 2012 (w/ English translation).

* cited by examiner (a)　　　　　　　　　　　　(b)

SOLID-STATE IMAGE CAPTURE ELEMENT OPTICAL FILTER AND APPLICATION THEREOF

TECHNICAL FIELD

The present invention relates to a solid-state image capture element optical filter and the use thereof. More particularly, the present invention relates to a solid-state image capture element optical filter which comprises a transparent resin substrate comprising a compound having an absorption maximum at a specific wavelength; and a solid-state imaging device and camera module which comprise the optical filter.

BACKGROUND ART

In solid-state imaging devices such as video camcorders, digital still cameras and camera-equipped cell phones, CCDs and CMOS image sensors which are solid-state image capture elements for color images are used. These solid-state image capture elements, in their light-receiving sections, utilize silicon photodiodes that are sensitive to near-infrared ray imperceptible to human eyes. In such solid-state image capture elements, it is required that spectral luminous efficacy correction be performed so that colors natural to human eyes are produced; therefore, an optical filter which selectively transmits or cuts light rays in a specific wavelength range is often used.

As such optical filters, those filters produced by a variety of methods have been conventionally used. For example, optical filters such as near-infrared cut filters in which a transparent resin is used as a base material and a near infrared-absorbing dye is incorporated in the transparent resin are widely known (see, for example, Patent Document 1). However, the optical filter described in Patent Document 1 does not necessarily have sufficient near infrared-absorbing capacity.

Further, the present applicant has proposed an optical filter comprising a squarylium-based compound having a specific structure (see Patent Document 2). When such an optical filter is used, the incidence angle dependence of the optical properties in the near-infrared region can be reduced, so that the viewing angle can be better improved than existing optical filters.

However, the use of only a compound showing absorption in the near-infrared region may not be able to sufficiently improve the incidence angle dependence of the optical properties in the near-infrared region such as a wavelength range of 300 to 420 nm. For example, as shown in FIG. 1, when a near-ultraviolet light B reflected by the surfaces of optical filter 6 and lens 5 enters the optical filter 6 at an angle larger than 0°, the reflected light cannot be cut sufficiently, so that violet and blue obscure images may be generated, which leads to a reduction in the camera image quality.

CITATION LIST

Patent Documents

Patent Document 1: JP-A-H6-200113
Patent Document 2: JP-A-2012-8532

SUMMARY OF THE INVENTION

Problems to be Solved by the Invention

An object of the present invention is to provide a solid-state image capture element optical filter having excellent visible light transmission characteristics with reduced incidence angle dependence even in the near-ultraviolet wavelength region, in which the defects of conventional optical filters such as near-infrared cut filters are improved; and a device comprising the optical filter.

Technical Solution

The present inventors intensively studied to solve the above-described problems. As a result, the present inventors discovered that the problems can be solved by an optical filter which comprises a transparent resin substrate comprising a compound having an absorption maximum in a wavelength range of 300 to 420 nm and a compound having an absorption maximum in a wavelength range of 600 to 800 nm, thereby completing the present invention. Embodiments of the present invention are described below.

[1] A solid-state image capture element optical filter, comprising: a transparent resin substrate which comprises a compound (X) having an absorption maximum in a wavelength range of 300 to 420 nm and a compound (Y) having an absorption maximum in a wavelength range of 600 to 800 nm; and a near infrared-reflecting film on at least one side of the substrate.

[2] The solid-state image capture element optical filter according to [1], wherein the compound (X) is at least one selected from the group consisting of azomethine-based compounds, indole-based compounds, benzotriazole-based compounds and triazine-based compounds.

[3] The solid-state image capture element optical filter according to [1] or [2], wherein the substrate comprises the compound (X) in an amount of 0.006 to 3.0 parts by weight and the compound (Y) in an amount of 0.004 to 2.0 parts by weight, with respect to 100 parts by weight of a transparent resin constituting the substrate.

[4] The solid-state image capture element optical filter according to any one of [1] to [3], wherein the transparent resin constituting the substrate is at least one selected from the group consisting of cyclic olefin-based resins, aromatic polyether-based resins, polyimide-based resins, fluorene polycarbonate-based resins, fluorene polyester-based resins, polycarbonate-based resins, polyamide-based resins, polyallylate-based resins, polysulfone-based resins, polyether sulfone-based resins, poly-p-phenylene-based resins, polyamide imide-based resins, polyethylene naphthalate-based resins, fluorinated aromatic polymer-based resins, (modified) acrylic resins, epoxy-based resins, allyl ester-based curable resins and silsesquioxane-based UV-curable resins.

[5] The solid-state image capture element optical filter according to any one of [1] to [4], being used as an optical filter for a solid-state imaging device.

[6] A solid-state imaging device, comprising the solid-state image capture element optical filter according to any one of [1] to [5].

[7] A camera module, comprising the solid-state image capture element optical filter according to any one of [1] to [5].

Advantageous Effects of Invention

According to the present invention, a solid-state image capture element optical filter having excellent visible light transmission characteristics with reduced incidence angle dependence even in the near-ultraviolet region can be provided.

BRIEF DESCRIPTION OF DRAWINGS

FIG. 2(*b*) is a cross-sectional schematic view showing one example of camera modules in which a solid-state image capture element optical filter 6' of the present invention is used.

DESCRIPTION OF EMBODIMENTS

The present invention will now be described concretely.
[Solid-state Image Capture Element Optical Filter]

The solid-state image capture element optical filter according to the present invention (hereinafter, also simply referred to as "the optical filter of the present invention") comprises: a transparent resin substrate comprising a compound (X) having an absorption maximum in a wavelength range of 300 to 420 nm and a compound (Y) having an absorption maximum in a wavelength range of 600 to 800 nm; and a near infrared-reflecting film on at least one side of the substrate. In the transparent resin substrate, the compounds (X) and (Y) may be contained in the same layer or separately in different layers. One example of a case where these compounds are contained in the same layer is an embodiment where the compounds (X) and (Y) are both contained in the same transparent resin substrate, and one example of a case where these compounds are contained in separate layers is an embodiment where a layer containing the compound (X) is laminated on a transparent resin substrate containing the compound (Y). It is more preferred that the compounds (X) and (Y) be contained in the same layer and, in such a case, the amounts of the compounds (X) and (Y) can be more easily controlled as compared to a case where these compounds are contained in different layers.
[Transparent Resin Substrate]

The transparent resin substrate constituting the optical filter of the present invention (hereinafter, also referred to as "the resin substrate") comprises a transparent resin and compounds (X) and (Y) and is capable of selectively and efficiently cut near-ultraviolet ray and near-infrared ray.

By using such a resin substrate in the optical filter, the maximum absolute value of the difference between the transmittance in a wavelength region of ±20 nm from a wavelength (H) on the longest wavelength side at which the transmittance of the optical filter measured in the vertical direction is 50% in a wavelength region of 300 to 450 nm and the transmittance of the optical filter measured at an angle of 30° with respect to the vertical direction in the same wavelength region (hereinafter, referred to as "maximum value (U)") is made small, so that an optical filter having a wide viewing angle with reduced incidence angle dependence can be obtained.

Figure 5:
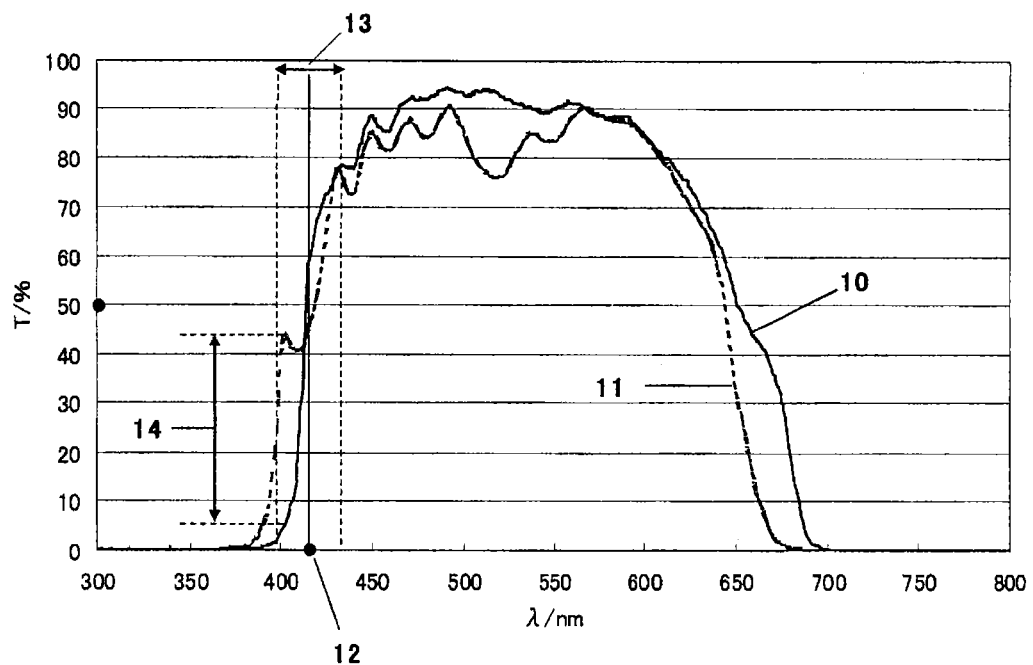
FIG. 5 shows one example of transmission spectra of a conventional solid-state image capture element optical filter measured in the vertical direction and at an angle of 30° with respect to the vertical direction.

Here, the wavelength (H) and the maximum value (U) will be explained referring to FIG. 5 that shows one example of a spectrum of transmittance 10 of a conventional solid-state image capture element optical filter measured in the vertical direction and one example of a spectrum of transmittance 11 measured at an angle of 30° with respect to the vertical direction. In the case of FIG. 5, the wavelength (H) at which the transmittance 10 measured in the vertical direction of the optical filter is 50% in a wavelength region of 300 to 450 nm is 415 nm as indicated by a symbol 12, and the maximum value (U), which is the absolute value of the difference between the transmittance 10 and the transmittance 11 in a wavelength region of ±20 nm from the wavelength (H) (395 to 435 nm), is 39% (transmittance 10: 5%, transmittance 11: 44%, wavelength: 403 nm) as indicated by a symbol 14.

The maximum value (U) is preferably less than 25%, more preferably less than 20%, particularly preferably less than 15%.

In applications such as camera modules, when the resin substrate comprising the compounds (X) and (Y) has a thickness of 100 μm, it is essential that the average transmittance of the substrate in the so-called visible region of 400 to 700 nm be 50% or higher, preferably 65% or higher.

The thickness of the resin substrate can be selected as appropriate in accordance with the desired application and it is not particularly restricted. However, it is preferred that the thickness of the resin substrate be adjusted such that the substrate has such an improved incidence angle dependence as described above, and the thickness is more preferably 30 to 250 μm, still more preferably 40 to 200 μm, particularly preferably 50 to 150 μm.

When the thickness of the resin substrate is in the above-described range, an optical filter using the substrate can be reduced in size and weight and can thus be suitably used in a variety of applications such as solid-state imaging devices. Particularly, the resin substrate is preferably used in a lens unit such as a camera module because it allows the lens to have a low profile.
<Compound (X)>

The compound (X) used in the present invention, which has an absorption maximum in a wavelength range of 300 to 420 nm, is generally referred to as "near-ultraviolet absorber" and may have two or more absorption maxima in this wavelength range. This compound (X) is not particularly restricted; however, it is preferably at least one selected from the group consisting of azomethine-based compounds, indole-based compounds, benzotriazole-based compounds and triazine-based compounds.
(A) Azomethine-Based Compound The azomethine-based compound is not particularly restricted and can be represented by, for example, the following Formula (1).

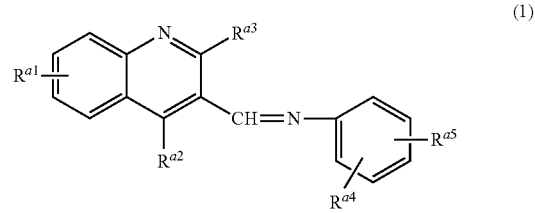

In the Formula (1), $R^{a1}$ to $R^{a5}$ each independently represent a hydrogen atom, a halogen atom, a hydroxy group, a carboxyl group, an alkyl group having 1 to 15 carbon atoms, an alkoxy group having 1 to 9 carbon atoms or an alkoxycarbonyl group having 1 to 9 carbon atoms.

(B) Indole-Based Compound

The indole-based compound is not particularly restricted and can be represented by, for example, the following Formula (2).

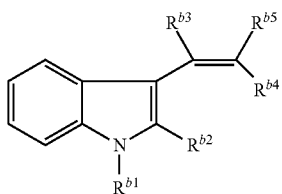

(2)

In the Formula (2), $R^{b1}$ to $R^{b5}$ each independently represent a hydrogen atom, a halogen atom, a hydroxy group, a carboxyl group, a cyano group, a phenyl group, an aralkyl group, an alkyl group having 1 to 9 carbon atoms, an alkoxy group having 1 to 9 carbon atoms or an alkoxycarbonyl group having 1 to 9 carbon atoms.

(C) Benzotriazole-Based Compound

The benzotriazole-based compound is not particularly restricted and can be represented by, for example, the following Formula (3).

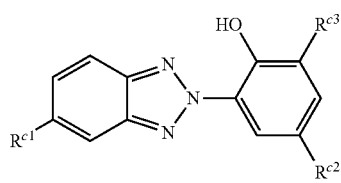

(3)

In the Formula (3), $R^{c1}$ to $R^{c3}$ each independently represent a hydrogen atom, a halogen atom, a hydroxy group, an aralkyl group, an alkyl group having 1 to 9 carbon atoms, an alkoxy group having 1 to 9 carbon atoms, or an alkyl group having 1 to 9 carbon atoms that contains an alkoxycarbonyl group having 1 to 9 carbon atoms as a substituent.

(D) Triazine-Based Compound

The triazine-based compound is not particularly restricted and can be represented by, for example, the following Formula (4), (5) or (6).

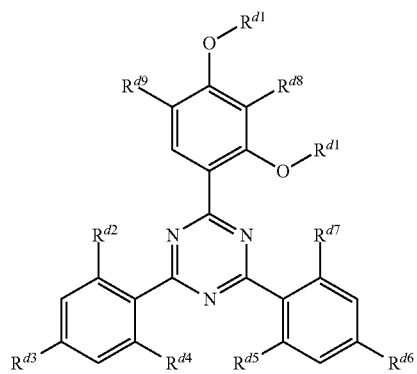

(4)

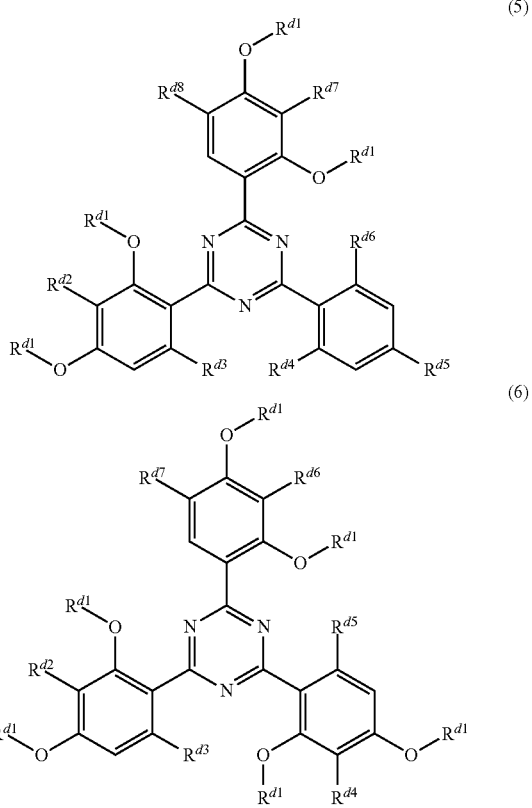

In the Formulae (4) to (6), $R^{d1}$s independently represent a hydrogen atom, an alkyl group having 1 to 15 carbon atoms, a cycloalkyl group having 3 to 8 carbon atoms, an alkenyl group having 3 to 8 carbon atoms, an aryl group having 6 to 18 carbon atoms, or an alkylaryl or arylalkyl group having 7 to 18 carbon atoms. These alkyl group, cycloalkyl group, alkenyl group, aryl group, alkylaryl group and arylalkyl group may be substituted with a hydroxy group, a halogen atom or an alkyl or alkoxy group having 1 to 12 carbon atoms or interrupted by an oxygen atom, a sulfur atom, a carbonyl group, an ester group, an amide group or an imino group. The substitution and the interruption may be combined. Further, $R^{d2}$ to $R^{d9}$ each independently represent a hydrogen atom, a halogen atom, a hydroxy group, an alkyl group having 1 to 15 carbon atoms, a cycloalkyl group having 3 to 8 carbon atoms, an alkenyl group having 3 to 8 carbon atoms, an aryl group having 6 to 18 carbon atoms, or an alkylaryl or arylalkyl group having 7 to 18 carbon atoms.

<Compound (Y)>

The compound (Y) used in the present invention, which has an absorption maximum in a wavelength range of 600 to 800 nm, preferably 620 to 780 nm, particularly preferably 650 to 750 nm, is generally referred to as "near infrared-absorbing dye" and may have two or more absorption maxima in this wavelength range. This compound (Y) is not particularly restricted, and it may be, for example, a squarylium-based compound, a phthalocyanine-based compound, a naphthalocyanine-based compound or a cyanine-based compound. By using the compound (Y), the incidence angle dependence of an optical filter can be improved not only in the near-ultraviolet wavelength region but also in the near-infrared wavelength region, so that an optical filter having a wide viewing angle can be obtained.

(A) Squarylium-Based Compound

It is preferred that the squarylium-based compound contains at least one selected from the group consisting of squarylium-based compounds represented by the following Formula (I) and squarylium-based compounds represented by the following Formula (II). These compounds are hereinafter also referred to as "compound (I)" and "compound (II)", respectively.

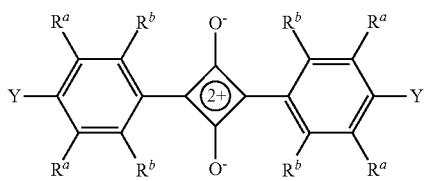

(I)

In the Formula (I), $R^a$, $R^b$ and Y satisfy the following condition (i) or (ii).

Condition (i)

The plural $R^a$s each independently represent a hydrogen atom, a halogen atom, a sulfo group, a hydroxy group, a cyano group, a nitro group, a carboxy group, a phosphate group, -$L^1$ or a —$NR^eR^f$ group. $R^e$ and $R^f$ each independently represent a hydrogen atom, -$L^a$, -$L^b$, -$L^c$, -$L^d$ or -$L^e$.

The plural $R^b$s each independently represent a hydrogen atom, a halogen atom, a sulfo group, a hydroxy group, a cyano group, a nitro group, a carboxy group, a phosphate group, -$L^1$ or a —$NR^gR^h$ group. $R^g$ and $R^h$ each independently represent a hydrogen atom, -$L_a$, -$L_b$, -$L_c$, -$L_d$, -$L^e$ or a —$C(O)R^i$ group (wherein, $R^i$ represents -$L^a$, -$L^b$, -$L^c$, -$L^d$ or -$L^e$).

The plural Ys each independently represent a —$NR^jR^k$ group. $R^j$ and $R^k$ each independently represent a hydrogen atom, -$L^a$, -$L^b$, -$L^c$, -$L^d$ or -$L^e$.

$L^1$ is $L_a$, $L_b$, $L_c$, $L_d$, $L^e$, $L^f$, $L^g$ or $L^h$.

The $L^a$ to $L^h$ are as follows:

($L^a$) an aliphatic hydrocarbon group having 1 to 9 carbon atoms which optionally has a substituent L, ($L^b$) a halogen-substituted alkyl group having 1 to 9 carbon atoms which optionally has a substituent L, ($L^c$) an alicyclic hydrocarbon group having 3 to 14 carbon atoms which optionally has a substituent L, ($L^d$) an aromatic hydrocarbon group having 6 to 14 carbon atoms which optionally has a substituent L, ($L^e$) a heterocyclic group having 3 to 14 carbon atoms which optionally has a substituent L, ($L^f$) an alkoxy group having 1 to 9 carbon atoms which optionally has a substituent L, ($L^g$) an acyl group having 1 to 9 carbon atoms which optionally has a substituent L, and ($L^h$) an alkoxycarbonyl group having 1 to 9 carbon atoms which optionally has a substituent L.

The substituent L is at least one selected from the group consisting of aliphatic hydrocarbon groups having 1 to 9 carbon atoms, halogen-substituted alkyl groups having 1 to 9 carbon atoms, alicyclic hydrocarbon groups having 3 to 14 carbon atoms, aromatic hydrocarbon groups having 6 to 14 carbon atoms and heterocyclic groups having 3 to 14 carbon atoms.

The $L^a$ to $L^h$ may further have at least one atom or group selected from the group consisting of a halogen atom, a sulfo group, a hydroxy group, a cyano group, a nitro group, a carboxy group, a phosphate group and an amino group.

In each of the $L^a$ to $L^h$, the total number of carbon atoms including those of a substituent (s) is preferably 50 or less, more preferably 40 or less, particularly preferably 30 or less. When the number of carbon atoms exceeds this range, the dye synthesis may be difficult and the absorption intensity per unit weight tends to be reduced.

Condition (ii)

At least one of two $R^a$s on one benzene ring binds with Y on the same benzene ring to form a heterocycle constituted by 5 or 6 atoms including at least one nitrogen atom, which heterocycle is optionally substituted, and $R^b$s and $R^a$s that are not involved in the formation of the heterocycle each independently have the same meaning as the $R^b$s and $R^a$s in the condition (i).

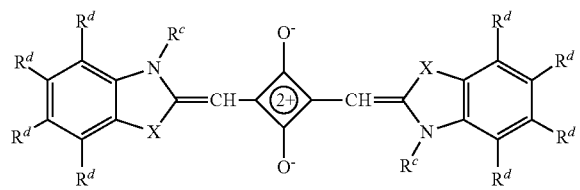

(II)

In the Formula (II), X represents O, S, Se, N—$R^c$ or C—$R^dR^d$; plural $R^c$s each independently represent a hydrogen atom, -$L^a$, -$L^b$, -$L^c$, -$L^d$ or -$L^e$; plural $R^d$s each independently represent a hydrogen atom, a halogen atom, a sulfo group, a hydroxy group, a cyano group, a nitro group, a carboxy group, a phosphate group, -$L^1$ or a —$NR^eR^f$ group; adjacent $R^d$s are optionally linked with each other to form a ring that is optionally substituted; and $L^a$ to $L^e$, $L^1$, $R^e$ and $R^f$ each have the same meaning as defined in the Formula (I).

In addition to the description method of the following Formulae (I-1) and (II-1), the structures of the compounds (I) and (II) can also be indicated by such a description method that the compounds (I) and (II) each assume a resonance structure as shown in the following Formulae (I-2) and (II-2). That is, the difference between the Formula (I-1) and the Formula (I-2) and the difference between the Formula (II-1) and the Formula (II-2) are only in the method of describing the respective structures, and both of these description methods indicate the same compounds. In the present invention, unless otherwise specified, the structures of squarylium-based compounds are indicated by such description method as seen in the following Formulae (I-1) and (II-1).

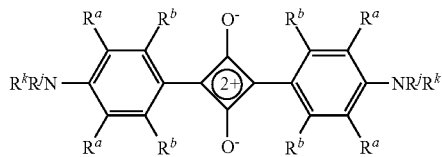

(I-1)

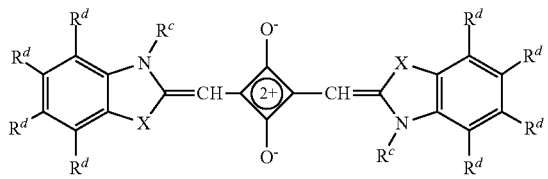

(II-1)

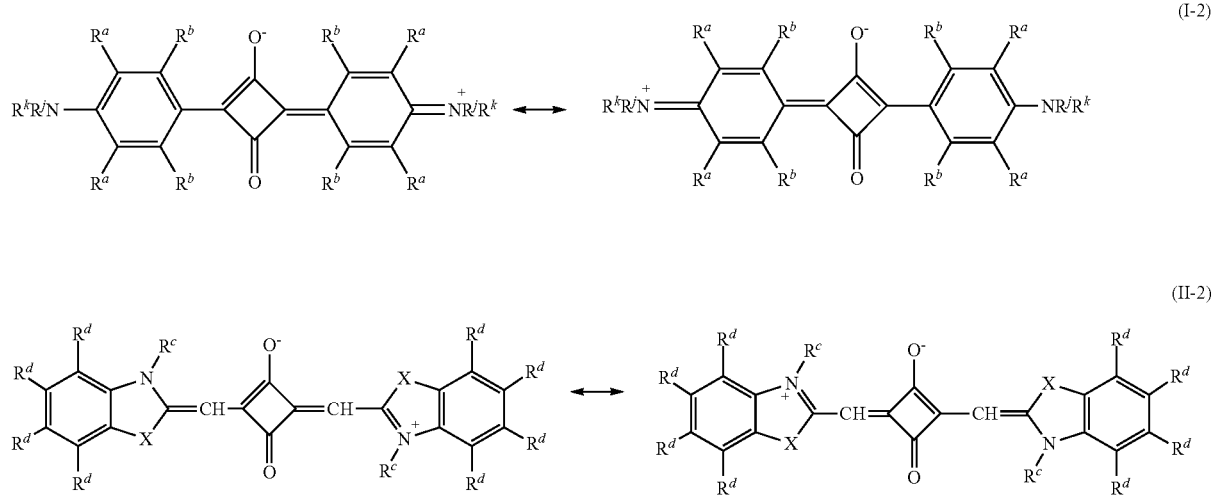

(I-2)

(II-2)

The structures of the compounds (I) and (II) are not particularly restricted as long as they satisfy the above-described requirements of the Formulae (I) and (II), respectively. For example, when the structures of the compounds (I) and (II) are represented by the Formulae (I-1) and (II-1), respectively, the substituents bound from each side to the four-membered ring in the center may be the same or different; however, the substituents are preferably the same because it makes the synthesis of the respective compounds easy. It is noted here that, for example, a compound represented by the following Formula (I-3) and a compound represented by the following Formula (I-4) are regarded as identical to each other.

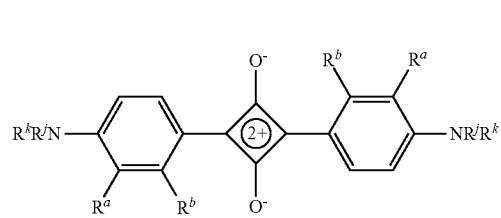

(I-3)

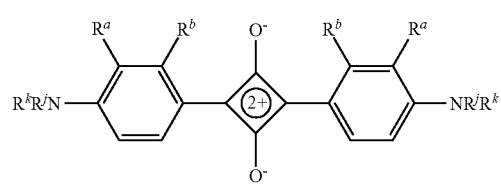

(I-4)

(B) Phthalocyanine-Based Compound

The structure of the phthalocyanine-based compound is not particularly restricted, and examples of the phthalocyanine-based compound include compounds represented by the following Formula (III).

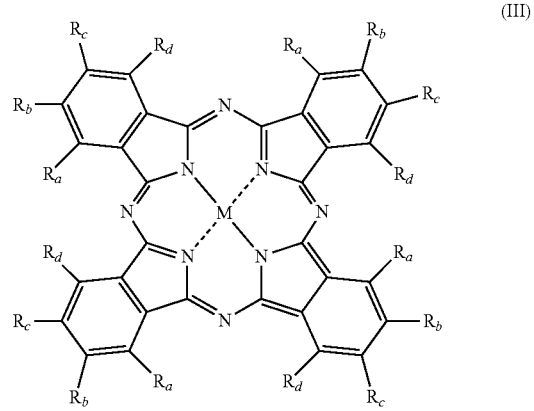

(III)

In the Formula (III), M represents two hydrogen atoms, two monovalent metal atoms, a divalent metal atom, or a substituted metal atom including a trivalent or tetravalent metal atom; and plural $R_a$s, $R_b$s, $R_c$ s and $R_d$s each independently represent a hydrogen atom, a halogen atom, a hydroxy group, a carboxy group, a nitro group, an amino group, an amide group, an imide group, a cyano group, a silyl group, $-L^1$, $-S-L^2$, $-SS-L^2$, $-SO_2-L^3$ or $-N=N-L^4$. Alternatively, the plural $R_a$s, $R_b$s, $R_c$s and $R_d$s represent at least one group selected from the group consisting of groups represented by the following Formulae (A) to (H) in which at least one combination of $R_a$ and $R_b$, $R_b$ and $R_c$, and $R_c$ and $R_d$ is bound. It is noted here that at least one of $R_a$, $R_b$, $R_c$ and $R_d$ bound to the same aromatic ring is not a hydrogen atom.

The amino group, amide group, imide group and silyl group optionally have the substituent L defined above in the Formula (I)

$L^1$ has the same meaning as defined in the Formula (I);

$L^2$ represents a hydrogen atom or any one of the $L^a$ to $L^e$ defined in the Formula (I);

$L^3$ represents a hydroxy group or any one of the $L^a$ to $L^e$; and $L^4$ represents any one of the $L^a$ to $L^e$.

(A) 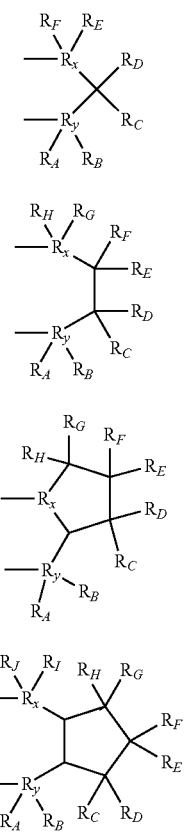

(B)

(C)

(D)

(E)

(F)

(G)

(H) 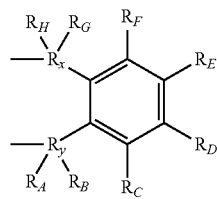

In the Formulae (A) to (H), $R_x$ and $R_y$ are each a combination of $R_a$ and $R_b$, $R_b$ and $R_c$, or $R_c$ and $R_d$; and plural $R_A$ to $R_L$ each independently represent a hydrogen atom, a halogen atom, a hydroxy group, a nitro group, an amino group, an amide group, an imide group, a cyano group, a silyl group, $-L^1$, $-S-L^2$, $-SS-L^2$, $-SO_2-L^3$ or $-N=N-L^4$, wherein the amino group, amide group, imide group and silyl group optionally have the substituent L, and the $L^1$ to $L^4$ each have the same meaning as defined in the Formula (III).

(C) Naphthalocyanine-Based Compound

The structure of the above-described naphthalocyanine-based compound is not particularly restricted, and examples of the naphthalocyanine-based compound include compounds that are represented by the following Formula (IV).

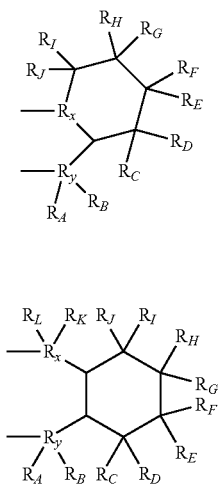

(IV)

In the Formula (IV), M has the same meaning as in the Formula (7); and $R_a$, $R_b$, $R_c$, $R_d$, $R_e$ and $R_f$ each independently represent a hydrogen atom, a halogen atom, a hydroxy group, a carboxy group, a nitro group, an amino group, an amide group, an imide group, a cyano group, a silyl group, $-L^1$, $-S-L^2$, $-SS-L^2$, $-SO_2-L^3$ or $-N=N-L^4$.

(D) Cyanine-Based Compound

The structure of the above-described cyanine-based compound is not particularly restricted, and examples of the cyanine-based compound include compounds that are represented by the following Formulae (V-1) to (V-3).

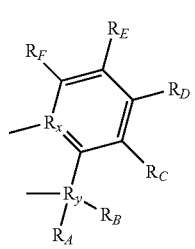

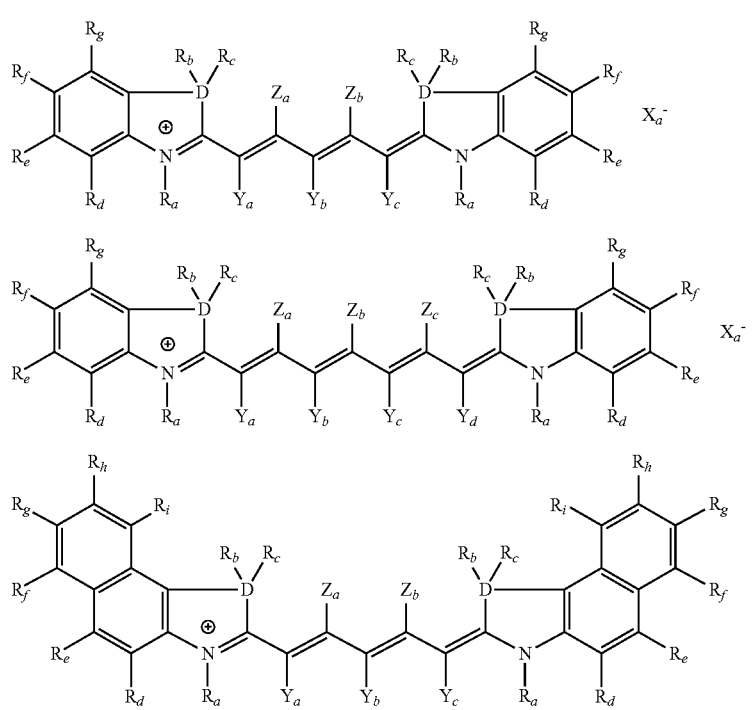

(V-1)

(V-2)

(V-3)

In the Formulae (V-1) to (V-3), $X_a^-$ represents a monovalent anion;

plural Ds independently represent a carbon atom, a nitrogen atom, an oxygen atom or a sulfur atom;

plural $R_a$, $R_b$, $R_c$, $R_d$, $R_e$, $R_f$, $R_g$, $R_h$ and $R_i$ each independently represent hydrogen atom, a halogen atom, a hydroxy group, a carboxy group, a nitro group, an amino group, an amide group, an imide group, a cyano group, a silyl group, -$L^1$, —S-$L^2$, —SS-$L^2$, —SO$_2$-$L^3$, —N=N-$L^4$, or at least one group selected from the group consisting of groups represented by the following Formulae (A) to (H) in which at least one combination of $R_b$ and $R_c$, $R_d$ and $R_e$, $R_e$ and $R_f$, $R_f$ and $R_g$, $R_g$ and $R_h$, and $R_h$ and $R_i$ is bound;

the amino group, the amide group, the imide group and the silyl group optionally have the substituent L defined in the Formula (I);

$L^1$ has the same meaning as defined in the Formula (I);

$L^2$ represents a hydrogen atom or any one of the $L^a$ to $L^e$ defined in the Formula (I);

$L^3$ represents a hydrogen atom or any one of the $L^a$ to $L^e$;

$L^4$ represents any one of the $L^a$ to $L^e$;

$Z_a$ to $Z_d$ and $Y_a$ to $Y_d$ each independently represent a hydrogen atom, a halogen atom, a hydroxy group, a carboxy group, a nitro group, an amino group, an amide group, an imide group, a cyano group, a silyl group, -$L^1$, —S-$L^2$, —SS-$L^2$, —SO$_2$-$L^3$, —N=N-$L^4$ (wherein, $L^1$ to $L^4$ each have the same meaning as in the $R_a$ to $R_i$), a 5- or 6-membered alicyclic hydrocarbon group which is formed by any two adjacent Zs or Ys bound with each other and optionally comprises at least one nitrogen atom, oxygen atom or sulfur atom, an aromatic hydrocarbon group having 6 to 14 carbon atoms which is formed by any two adjacent Zs or Ys bound with each other, or a heteroaromatic hydrocarbon group having 3 to 14 carbon atoms which is formed by any two adjacent Zs or Ys bound with each other and comprises at least one nitrogen atom, oxygen atom or sulfur atom, which alicyclic hydrocarbon group, aromatic hydrocarbon group and heteroaromatic hydrocarbon group also optionally comprise an aliphatic hydrocarbon group having 1 to 9 carbon atoms or a halogen atom.

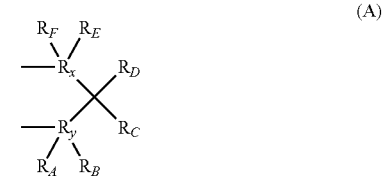

(A)

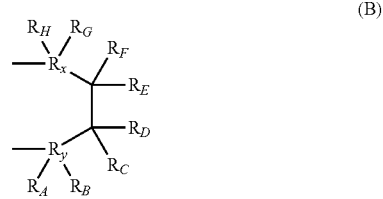

(B)

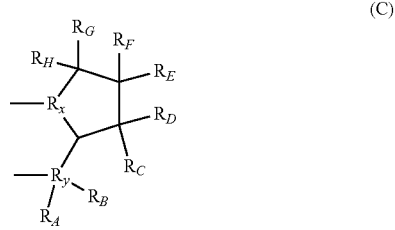

(C)

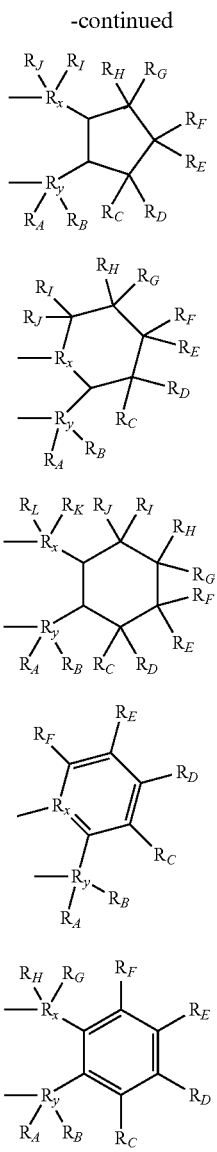

In the Formulae (A) to (H), $R_x$ and $R_y$ are each a combination of $R_b$ and $R_c$, $R_d$ and $R_e$, $R_e$ and $R_f$, $R_f$ and $R_g$, $R_g$ and $R_h$, or $R_h$ and $R_i$; and plural $R_A$ to $R_L$ each independently represent a hydrogen atom, a halogen atom, a hydroxy group, a carboxy group, a nitro group, an amino group, an amide group, an imide group, a cyano group, a silyl group, -L$^1$, —S-L$^2$, —SS-L$^2$, —SO$_2$-L$^3$ or —N=N-L$^4$ (wherein, L$^1$ to L$^4$ each have the same meaning as defined in the Formulae (V-1) to (V-3)), which amino group, amide group, imide group and silyl group optionally have the substituent L.

<Other Dyes>

In the present invention, in addition to the compounds (X) and (Y), a dye (Z) having an absorption maximum in a wavelength range of longer than 800 nm but not longer than 1,300 nm can be used as other dye. This dye (Z) is not particularly restricted, and examples thereof include phthalocyanine-based compounds, naphthalocyanine-based compounds, cyanine-based compounds, squarylium-based compounds, croconium-based compounds, dithiol-based compounds, diimonium-based compounds and porphyrin-based compounds. As these dyes, for example, those that are exemplified in JP-A-2006-284756, JP-A-2008-303130, Japanese Patent No. 4919629 and Japanese Patent No. 4083730 can be used. The amount of the dye (Z) to be incorporated is not particularly restricted as long as it is within a range that does not adversely affect the effects of the present invention, and it is preferably 0.01 to 10.0 parts by weight with respect to 100 parts by weight of a resin constituting the resin substrate. By using the dye (Z), an optical filter showing further improved absorption characteristics in a long wavelength range of 800 nm or longer can be obtained and good camera image quality can thus be achieved.

<Contents of Compound (X) and Compound (Y)>

In the resin substrate, the content of the compound (X) is preferably 0.006 to 3.0 parts by weight, more preferably 0.02 to 2.5 parts by weight, particularly preferably 0.05 to 2.0 parts by weight, with respect to 100 parts by weight of a resin constituting the resin substrate. The content of the compound (Y) is preferably 0.004 to 2.0 parts by weight, more preferably 0.01 to 1.5 parts by weight, particularly preferably 0.02 to 1.0 parts by weight, with respect to 100 parts by weight of a resin constituting the resin substrate. When the content of the compound (X) and that of the compound (Y) are in these ranges, both good absorption characteristics and high visible light transmittance can be attained in their respective absorption wavelength ranges.

<Resin>

The transparent resin used in the resin substrate is not particularly restricted as long as it does not adversely affect the effects of the present invention. For example, in order to ensure thermal stability and formability into a film and to obtain a film on which a dielectric multilayer film can be formed by high-temperature vapor deposition performed at a temperature of 100° C. or higher, the transparent resin is, for example, one which has a glass transition temperature (Tg) of preferably 110 to 380° C., more preferably 110 to 370° C., still more preferably 120 to 360° C. Further, the glass transition temperature of the transparent resin is particularly preferably 140° C. or higher because a film on which a dielectric multilayer film can be formed by vapor deposition at a higher temperature can be obtained.

As the transparent resin, a resin whose total light transmittance at a thickness of 0.1 mm (JIS K7105) is preferably 75 to 95%, more preferably 78 to 95%, particularly preferably 80 to 95%, can be employed. When the total light transmittance is in this range, the resulting substrate shows good transparency as an optical film.

Examples of the transparent resin include cyclic olefin-based resins, aromatic polyether-based resins, polyimide-based resins, fluorene polycarbonate-based resins, fluorene polyester-based resins, polycarbonate-based resins, polyamide (aramid)-based resins, polyallylate-based resins, polysulfone-based resins, polyether sulfone-based resins, poly-p-phenylene-based resins, polyamide imide-based resins, polyethylene naphthalate (PEN)-based resins, fluorinated aromatic polymer-based resins, (modified) acrylic resins, epoxy-based resins, allyl ester-based curable resins and silsesquioxane-based UV-curable resins.

(A) Cyclic Olefin-Based Resin

The cyclic olefin-based resin is preferably a resin which is obtained from at least one monomer selected from the group consisting of monomers represented by the following Formula (13) and monomers represented by the following Formula (14), or a resin which is obtained by further hydrogenating a resin obtained above as required.

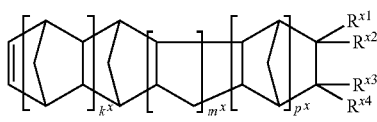

(13)

In the Formula (13), $R^{x1}$ to $R^{x4}$ each independently represent an atom or group selected from the following (i') to (ix'); and $k^x$, $m^x$ and $p^x$ each independently represent 0 or a positive integer.

(i') a hydrogen atom (ii') a halogen atom (iii') a trialkylsilyl group (iv') a substituted or unsubstituted hydrocarbon group having 1 to 30 carbon atoms, which comprises a linking group containing an oxygen atom, a sulfur atom, a nitrogen atom or a silicon atom (v') a substituted or unsubstituted hydrocarbon group having 1 to 30 carbon atoms (vi') a polar group (excluding (iv'))

(vii') $R^{x1}$ and $R^{x2}$ or $R^{x3}$ and $R^{x4}$ bind with each other to form an alkylidene group, and $R^{x1}$ to $R^{x4}$ that are not involved in the binding each independently represent an atom or group selected from the above-described (i') to (vi')

(viii') $R^{x1}$ and $R^{x2}$ or $R^{x3}$ and $R^{x4}$ bind with each other and represent, together with the carbon atoms bound thereto, a monocyclic or polycyclic hydrocarbon ring or heterocycle, and $R^{x1}$ to $R^{x4}$ that are not involved in the binding each independently represent an atom or group selected from the above-described (i') to (vi')

(ix') $R^{x2}$ and $R^{x3}$ bind with each other and represent, together with the carbon atoms bound thereto, a monocyclic hydrocarbon ring or heterocycle, and $R^{x1}$ to $R^{x4}$ that are not involved in the binding each independently represent an atom or group selected from the above-described (i') to (vi').

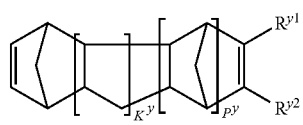

(14)

In the Formula (14), $R^{y1}$ and $R^{y2}$ each independently represent an atom or group selected from the above-described (i') to (vi'), or the following (x'); and $K^y$ and $P^y$ each independently represent 0 or a positive integer:

(x') $R^{y1}$ and $R^{y2}$ bind with each other to form a monocyclic or polycyclic alicyclic hydrocarbon, aromatic hydrocarbon or heterocycle.

(B) Aromatic Polyether-Based Resin

It is preferred that the aromatic polyether-based resin comprise at least one structural unit selected from the group consisting of structural units represented by the following Formula (15) and structural units represented by the following Formula (16).

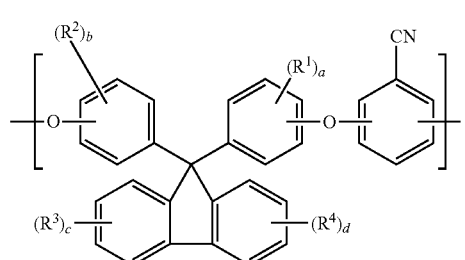

(15)

In the Formula (15), $R^1$ to $R^4$ each independently represent a monovalent organic group having 1 to 12 carbon atoms; and a to d each independently represent an integer of 0 to 4.

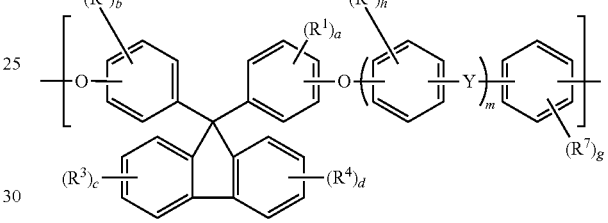

(16)

In the Formula (16), $R^1$ to $R^4$ and a to d each have the same meaning as in the Formula (15); Y represents a single bond, $-SO_2-$ or $>C=O$; $R^7$ and $R^8$ each independently represent a halogen atom, a monovalent organic group having 1 to 12 carbon atoms or a nitro group; g and h each independently represent an integer of 0 to 4; and m represents 0 or 1. It is noted here, however, that $R^7$ is not a cyano group when m is 0.

It is also preferred that the aromatic polyether-based resin further comprise at least one structural unit selected from the group consisting of structural units represented by the following Formula (17) and structural units represented by the following Formula (18).

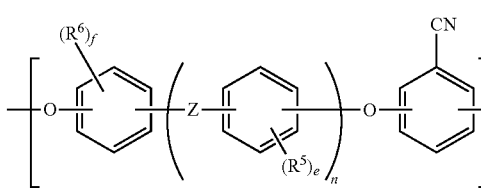

(17)

In the Formula (17), $R^5$ and $R^6$ each independently represent a monovalent organic group having 1 to 12 carbon atoms; Z represents a single bond, $-O-$, $-S-$, $-SO_2-$, $>C=O$, $-CONH-$, $-COO-$ or a divalent organic group having 1 to 12 carbon atoms; e and f each independently represent an integer of 0 to 4; and n represents 0 or 1.

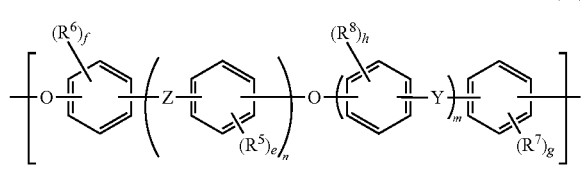

(18)

In the Formula (18), $R^7$, $R^8$, Y, m, g and h each have the same meaning as in the Formula (16); and $R^6$, $R^6$, Z, n, e and f each have the same meaning as in the Formula (17).

(C) Polyimide-Based Resin

The polyimide-based resin is not particularly restricted and it may be any high-molecular compound comprising an imide bond in a repeating unit. The polyimide-based resin can be synthesized by, for example, the method described in JP-A-2006-199945 or JP-A-2008-163107.

(D) Fluorene Polycarbonate-Based Resin

The fluorene polycarbonate-based resin is not particularly restricted and it may be any polycarbonate resin comprising a fluorene moiety. The fluorene polycarbonate-based resin can be synthesized by, for example, the method described in JP-A-2008-163194.

(E) Fluorene Polyester-Based Resin

The fluorene polyester-based resin is not particularly restricted and it may be any polyester resin comprising a fluorene moiety. The fluorene polyester-based resin can be synthesized by, for example, the method described in JP-A-2010-285505 or
JP-A-2011-197450.

(F) Fluorinated Aromatic Polymer-Based Resin

The fluorinated aromatic polymer-based resin is not particularly restricted and it may be any polymer which comprises an aromatic ring having at least one fluorine and a repeating unit containing at least one bond selected from the group consisting of an ether bond, a ketone bond, a sulfone bond, an amide bond, an imide bond and an ester bond. The fluorinated aromatic polymer-based resin can be synthesized by, for example, the method described in JP-A-2008-181121.

(G) Commercially Available Products

Examples of commercial-available transparent resins include the following commercial products. Examples of commercial products of the cyclic olefin-based resin include ARTON manufactured by JSR Corporation, ZEONOR manufactured by ZEON Corporation, APEL manufactured by Mitsui Chemicals, Inc. and TOPAS manufactured by Polyplastics Co., Ltd. Examples of commercial products of the polyether sulfone-based resin include SUMIKA EXCEL PES manufactured by Sumitomo Chemical Co., Ltd. Examples of commercial products of the polyimide-based resin include NEOPRIM L manufactured by Mitsubishi Gas Chemical Company, Inc. Examples of commercial products of the polycarbonate-based resin include PURE-ACE manufactured by TEIJIN Ltd. Examples of commercial products of the fluorene polycarbonate-based resin include YUPIZETA EP-5000 manufactured by Mitsubishi Gas Chemical Company, Inc. Examples of commercial products of the fluorene polyester-based resin include OKP4HT manufactured by Osaka Gas Chemicals Co., Ltd. Examples of commercial products of the acrylic resin include ACRYVIEWA manufactured by Nippon Shokubai Co., Ltd. Examples of commercial products of the silsesquioxane-based UV-curable resin include SILPLUS manufactured by Nippon Steel Chemical Co., Ltd.

<Other Components>

In the resin substrate, additives such as an antioxidant and a metal complex-based compound can be further incorporated within a range that does not adversely affect the effects of the present invention. In addition, in cases where a resin substrate is produced by cast-molding described below, the resin substrate can be easily produced with an addition of a leveling agent and/or an antifoaming agent. These other components may be used individually, or two or more thereof may be used in combination.

Examples of the antioxidant include 2,6-di-t-butyl-4-methylphenol, 2,2'-dioxy-3,3'-di-t-butyl-5,5'-dimethyldiphenylmethane and tetrakis[methylene-3-(3,5-di-t-butyl-4-hydroxyphenyl)propionate]methane.

It is noted here that these additives may be mixed with a resin and the like when producing a resin substrate, or may be added when a resin is produced. Further, although the amount of additive(s) to be added is selected as appropriate in accordance with the desired property, it is normally 0.01 to 5.0 parts by weight, preferably 0.05 to 2.0 parts by weight, with respect to 100 parts by weight of a resin.

<Method of Producing Resin Substrate>

The resin substrate can be produced by, for example, melt-molding or cast-molding.

(A) Melt-Molding

The resin substrate can be produced by, for example, a method in which a pellet obtained by melt-kneading a resin with the compounds (X) and (Y) and the like is melt-molded; a method in which a resin composition containing a resin, the compounds (X) and (Y) and the like is melt-molded; or a method in which a pellet obtained by removing a solvent from a resin composition containing a resin, the compounds (X) and (Y), the solvent and the like is melt-molded. Examples of melt-molding method include injection molding, melt-extrusion molding and blow molding.

The solvent is not particularly restricted as long as it is a solvent that is commonly used in organic synthesis and the like. Examples of such as solvent include hydrocarbons such as hexane and cyclohexane; alcohols such as methanol, ethanol, isopropanol, butanol and octanol; ketones such as acetone, methyl ethyl ketone, methyl isobutyl ketone and cyclohexanone; esters such as ethyl acetate, butyl acetate, ethyl lactate, γ-butyrolactone, propylene glycol monomethyl ether acetate and propylene glycol monoethyl ether acetate; ethers such as ethylene glycol monomethyl ether and diethylene glycol monobutyl ether; aromatic hydrocarbons such as benzene, toluene and xylene; halogenated hydrocarbons such as methylene chloride, chloroform and carbon tetrachloride; and amides such as dimethylformamide, dimethylacetamide and N-methylpyrrolidone. These solvents may be used individually, or two or more thereof may be used in combination.

(B) Cast-Molding

The resin substrate can also be produced by, for example, a method in which a resin composition containing a resin, the compounds (X) and (Y), a solvent and the like is cast on an appropriate base material and the solvent is subsequently removed; a method comprising casting a resin composition containing a coating agent(s), such as a reflection inhibitor, a hard-coat agent and/or an antistatic agent, the compounds (X) and (Y), a resin and the like on an appropriate base material; or a method in which a curable composition containing a coating agent (s), such as a reflection inhibitor, a hard-coat agent and/or an antistatic agent, the compounds (X) and (Y), a resin and the like is cast on an appropriate base material and subsequently cured and dried. As the solvent, the same solvents as those exemplified above in "(A) Melt-Molding" can be employed.

Examples of the base material include a glass plate, a steel belt, a steel drum and a transparent resin (e.g., a polyester film, a cyclic olefin-based resin film).

The resin substrate can be obtained by removing a coating film from such a base material. Alternatively, as long as the effects of the present invention are not adversely affected, a laminate of such a base material and a coating film may be used as the resin substrate without removing the coating film from the base material.

Further, the resin substrate can also be formed directly on an optical component by, for example, a method of coating an optical component made of a glass plate, quartz, transparent plastic or the like with the resin composition and subsequently drying the solvent, or a method of coating the curable composition and subsequently curing and drying the thus coated curable composition.

The amount of residual solvent in a resin substrate obtained by the above-described method is preferably as small as possible, and it is usually 3% by weight or less, preferably 1% by weight or less, more preferably 0.5% by weight or less, with respect to 100 parts by weight of a resin contained in the resin substrate. When the amount of residual solvent is in the above-described range, a resin substrate in which deformation and changes in the properties are not likely to occur and a desired function can be easily exerted can be obtained.

[Near Infrared-Reflecting Film]

The optical filter of the present invention comprises a near infrared-reflecting film on at least one side of the resin substrate.

A near infrared-reflecting film that can be used in the present invention is a film having an ability to reflect near-infrared ray. As such a near infrared-reflecting film, for example, an aluminum vapor-deposited film, a noble metal thin film, a resin film in which metal oxide particles containing indium oxide as a main component and a small amount of tin oxide are dispersed, or a dielectric multilayer film in which a high-refractive-index material layer and a low-refractive-index material layer are alternately stacked can be employed. By incorporating such a near infrared-reflecting film, near-infrared ray can be cut even more effectively.

In the present invention, a near infrared-reflecting film may be arranged on one side of a resin substrate, or it may be arranged on both sides of a resin substrate. When a near infrared-reflecting film is arranged on one side of a resin substrate, excellent production cost and ease of production are attained, while when a near infrared-reflecting film is arranged on both sides of a resin substrate, an optical filter which has a high strength and is not likely to suffer warping can be obtained.

Among the above-described near infrared-reflecting films, a dielectric multilayer film in which a high-refractive-index material layer and a low-refractive-index material layer are alternately stacked is more preferably used.

As a material constituting the high-refractive-index material layer, a material having a refractive index of 1.7 or higher can be used, and a material having a refractive index in the range of 1.7 to 2.5 is preferably selected. Examples of such a material include those materials which contain titanium oxide, zirconium oxide, tantalum pentoxide, niobium pentoxide, lanthanum oxide, yttrium oxide, zinc oxide, zinc sulfide, indium oxide or the like as a main component and titanium oxide, tin oxide and/or cerium oxide in a small amount (for example, 0 to 10% with respect to the main component).

As a material constituting the low-refractive-index material layer, a material having a refractive index of 1.6 or lower can be used, and a material having a refractive index in the range of 1.2 to 1.6 is preferably selected. Examples of such a material include silica, alumina, lanthanum fluoride, magnesium fluoride and sodium hexafluoroaluminate.

The method of stacking a high-refractive-index material layer and a low-refractive-index material layer is not particularly restricted as long as it forms a dielectric multilayer film in which these material layers are stacked. For example, a dielectric multilayer film in which a high-refractive-index material layer and a low-refractive-index material layer are alternately stacked can be directly formed on the resin substrate by a CVD method, a sputtering method, a vacuum-deposition method, an ion-assisted vapor-deposition method, an ion-plating method or the like.

It is preferred that each of these high-refractive-index material layer and low-refractive-index material layer normally have a thickness of $0.1\lambda$ to $0.5\lambda$, taking the wavelength of the near-infrared ray to be blocked as $\lambda$ (nm). When the thicknesses of these layers are in this range, the optical film thickness, which is a thickness that a product of refractive index (n) and film thickness (d) (n×d) is $\lambda/4$, is substantially the same as the thickness of each of the high-refractive-index material layer and the low-refractive index material layer, so that blockage and transmission of a specific wavelength tends to become easily controllable based on the relationships in the optical properties of reflection and refraction.

In a dielectric multilayer film, it is desired that the total number of the high-refractive-index material layers and the low-refractive-index material layers be 5 to 60, preferably 6 to 50.

Further, in cases where the substrate is warped when a dielectric multilayer film is formed thereon, in order to resolve this problem, for example, a method of forming a dielectric multilayer film on both sides of the substrate can be employed.

[Other Functional Films]

In the optical filter of the present invention, between a resin substrate and a near infrared-reflecting film such as a dielectric multilayer film, on the surface of a resin substrate opposite to the surface on which a near infrared-reflecting film is arranged or on the surface of a near infrared-reflecting film opposite to the surface on which a resin substrate is arranged, for the purpose of, for example, improving the surface hardness of the resin substrate and near infrared-reflecting film, improving their chemical resistance, providing antistaticity and preventing damages, a functional film such as an anti-reflection film, a hard coat film or an antistatic film can be provided as appropriate in such a manner that the effects of the present invention are not adversely affected.

The optical filter of the present invention may comprise one or more layers composed of the functional films. In cases where the optical filter of the present invention comprises two or more layers that are composed of the functional films, the two or more layers may be the same or different.

The method of laminating a functional film is not particularly restricted, and examples thereof include those methods in which, for example, a coating agent(s) such as a reflection inhibitor, a hard-coat agent and/or an antistatic agent is/are melt-molded or cast-molded on a resin substrate or near infrared-reflecting film in the same manner as described above.

Further, a functional film can also be produced by applying a curable composition containing the coating agent (s) and the like on a resin substrate or near infrared-reflecting film using a bar coater or the like and then curing the curable composition by UV irradiation or the like.

Examples of the coating agent include ultraviolet (UV)/electron beam (EB)-curable resins and thermosetting resins, specifically, vinyl compounds and urethane-based, urethane acrylate-based, acrylate-based, epoxy-based and epoxy acrylate-based resins. Examples of the curable composition containing these coating agents include vinyl-based, urethane-based, urethane acrylate-based, acrylate-based, epoxy-based and epoxy acrylate-based curable compositions.

Further, the curable composition may also contain a polymerization initiator. As the polymerization initiator, any known photopolymerization initiator or heat polymerization initiator can be used, and a photopolymerization initiator and a heat polymerization initiator may be used in combination as well. Such polymerization initiators may be used individually, or two or more thereof may be used in combination.

In the curable composition, the blending ratio of the polymerization initiator(s) is preferably 0.1 to 10% by weight, more preferably 0.5 to 10% by weight, still more preferably 1 to 5% by weight, taking the total amount of the curable composition as 100% by weight. When the blending ratio of the polymerization initiator(s) is in the above-described range, the curable composition has excellent curability and ease of handling and can thus yield a functional film, such as an antireflection film, a hard coat film or an antistatic film, which has a desired hardness.

Further, to the curable composition, an organic solvent may also be added as a solvent. As the organic solvent, any known organic solvent can be used. Specific examples thereof include alcohols such as methanol, ethanol, isopropanol, butanol and octanol; ketones such as acetone, methyl ethyl ketone, methyl isobutyl ketone and cyclohexanone; esters such as ethyl acetate, butyl acetate, ethyl lactate, γ-butyrolactone, propylene glycol monomethyl ether acetate and propylene glycol monoethyl ether acetate; ethers such as ethylene glycol monomethyl ether and diethylene glycol monobutyl ether; aromatic hydrocarbons such as benzene, toluene and xylene; and amides such as dimethylformamide, dimethylacetamide and N-methylpyrrolidone. These solvents may be used individually, or two or more thereof may be used in combination.

The thickness of the functional film is preferably 0.1 μm to 20 μm, more preferably 0.5 μm to 10 μm, particularly preferably 0.7 μm to 5 μm.

Further, in order to improve the adhesion between a resin substrate and a functional film and/or a near infrared-reflecting film or between a functional film and a near infrared-reflecting film, the resin substrate and/or the functional film may also be subjected to a surface treatment such as corona treatment or plasma treatment.

[Properties, Etc. of Solid-State Image Capture Element Optical Filter]

The optical filter of the present invention has excellent light transmission characteristics and is thus not subjected to any restriction when used. By using the compounds (X) and (Y), a solid-state image capture element optical filter which not only has reduced incidence angle dependence but also shows a high visible light transmittance as well as an effect of reducing violet and blue obscure images can be obtained.

[Application of Solid-State Image Capture Element Optical Filter]

The optical filter of the present invention has a wide viewing angle and exhibits excellent near ultraviolet-cutting capacity, near infrared-cutting capacity and the like. Therefore, the optical filter of the present invention is useful as a spectral luminous efficacy correction filter of a solid-state image sensing element such as CCD or CMOS image sensor of a camera module. More particularly, the optical filter of the present invention is useful for digital still cameras, cell phone cameras, digital video camcorders, PC cameras, surveillance cameras, vehicle onboard cameras, televisions, car navigation systems, personal digital assistant devices, personal computers, video game consoles, portable game consoles, fingerprint recognition systems, digital music players and the like.

<Solid-State Imaging Device>

The solid-state imaging device of the present invention comprises the optical filter of the present invention. Here, the term "solid-state imaging device" refers to an image sensor comprising a solid-state image capturing element, such as a CCD or CMOS image sensor, and specifically, the solid-state imaging device can be used in applications such as digital still cameras, cell phone cameras and digital video camcorders.

<Camera Module>

Figure 1:
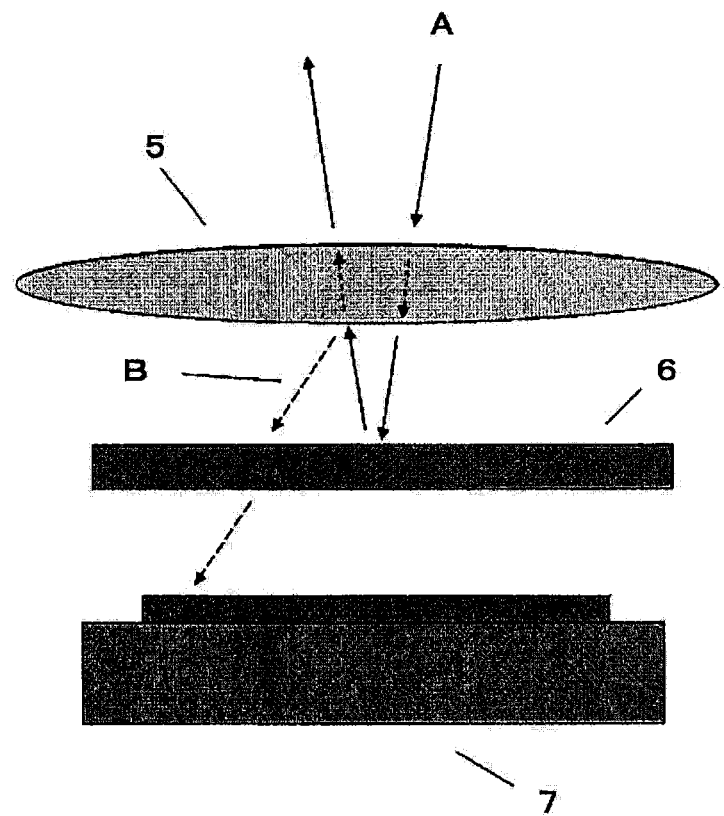
FIG. 1 is a schematic view showing a case where light reflected by the surfaces of optical filter 6 and lens 5 enters the optical filter 6 at an incidence angle larger than 0°.
Figure 2:
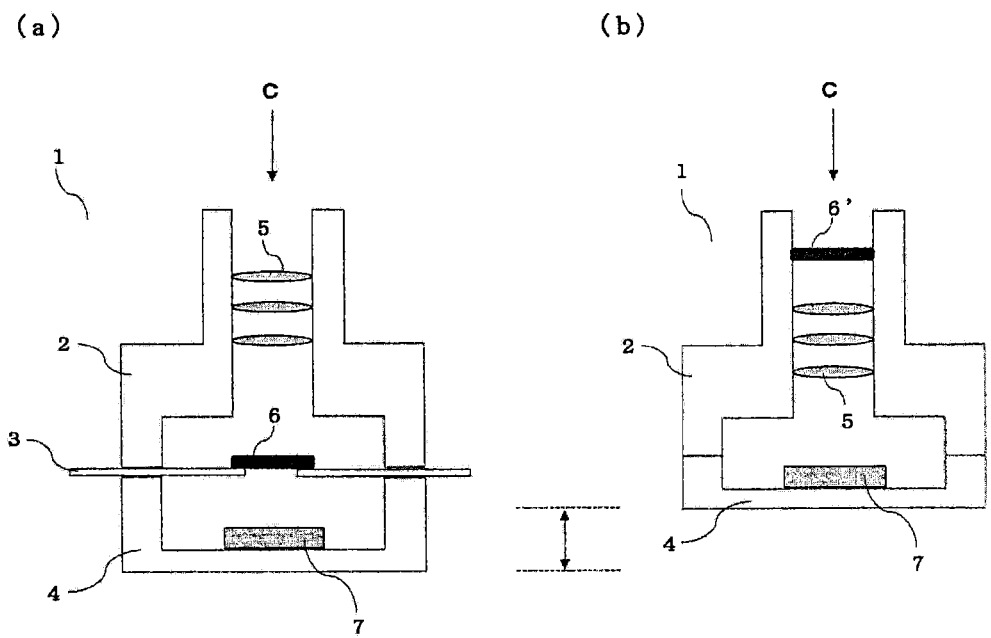
FIG. 2(*a*) is a cross-sectional schematic view showing one example of conventional camera modules.

The camera module of the present invention comprises the optical filter of the present invention. A case where the optical filter of the present invention is used in a camera module will now be described concretely. FIG. 2 shows a cross-sectional schematic view of a camera module.

FIG. 2 (a) is a cross-sectional schematic view showing the structure of a conventional camera module, and FIG. 2 (b) is a cross-sectional schematic view showing one of possible structures of a camera module in which an optical filter 6' of the present invention is used. In FIG. 2(b), the optical filter 6' of the present invention is arranged above a lens 5; however, as shown in FIG. 2(a), the optical filter 6' of the present invention can also be arranged between the lens 5 and an image sensor 7.

In a conventional camera module, incoming light is required to enter an optical filter 6 substantially perpendicularly thereto. Therefore, it is necessary to arrange the optical filter 6 between the lens 5 and the image sensor 7.

Here, the image sensor 7 is highly sensitive and may fail to properly operate due to mere contact with dust of about 5 μm in size; therefore, it is required that the optical filter 6 to be arranged above the image sensor 7 produce no dust and contain no foreign substance. In addition, it is necessary to provide a prescribed gap between the optical filter 6 and the image sensor 7, and this is one of the factors impeding low-profiling of the camera module.

In contrast, in the optical filter 6' of the present invention, there is no large difference in terms of transmitting light spectrum between the light coming into the optical filter 6' in the vertical direction and the light coming into the optical filter 6' at an angle of 30° with respect to the vertical direction (the absorption (transmission) wavelength has a small dependence on the incidence angle); therefore, it is not required to arrange the optical filter 6' between the lens 5 and the image sensor 7, and the optical filter 6' can thus be arranged above the lens 5 as well.

Accordingly, when the optical filter 6' of the present invention is used in a camera module, the camera module has excellent ease of handling and, since it is not necessary to provide a prescribed gap between the optical filter 6' and the sensor 7, the camera module can be made to have a low profile.

EXAMPLES

The present invention will now be described more concretely by way of examples thereof; however, the present invention is not restricted thereto by any means. It is noted here that, unless otherwise specified, "part(s)" means "part(s) by weight". Further, the respective physical properties were measured and evaluated by the methods described below.

<Molecular Weight>

Taking into consideration the solubility of each resin in a solvent and the like, the molecular weight of each resin was measured by the following method (a) or (b).

(a) Using a gel permeation chromatography (GPC) apparatus manufactured by Waters Corp. (Model 150C, column: H-type column manufactured by Tosoh Corporation, developing solvent: o-dichlorobenzene), the weight-average molecular weight (Mw) and the number-average molecular weight (Mn) were measured in terms of standard polystyrene.

(b) Using a GPC apparatus manufactured by Tosoh Corporation (Model HLC-8220, column: TSKgel α-M, developing solvent: THF), the weight-average molecular weight (Mw) and the number-average molecular weight (Mn) were measured in terms of standard polystyrene.

<Glass Transition Temperature (Tg)>

The glass transition temperature was measured using a differential scanning calorimeter manufactured by SII Nano-Technology Inc. (DSC6200) at a heating rate of 20° C./minute under nitrogen gas flow.

<Spectral Transmittance>

The absorption maximum, the transmittance in each wavelength region and the maximum value (U) were measured using a spectrophotometer manufactured by Hitachi High-Technologies Corporation (U-4100).

Figure 3:
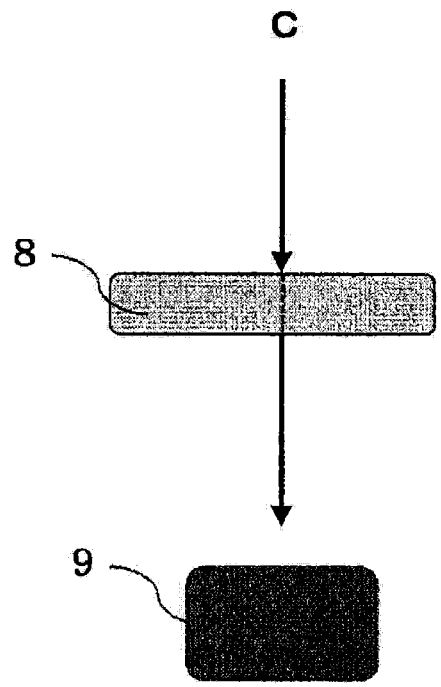
FIG. 3 is a schematic view showing a method of measuring the transmittance of a solid-state image capture element optical filter in the vertical direction.
Figure 4:
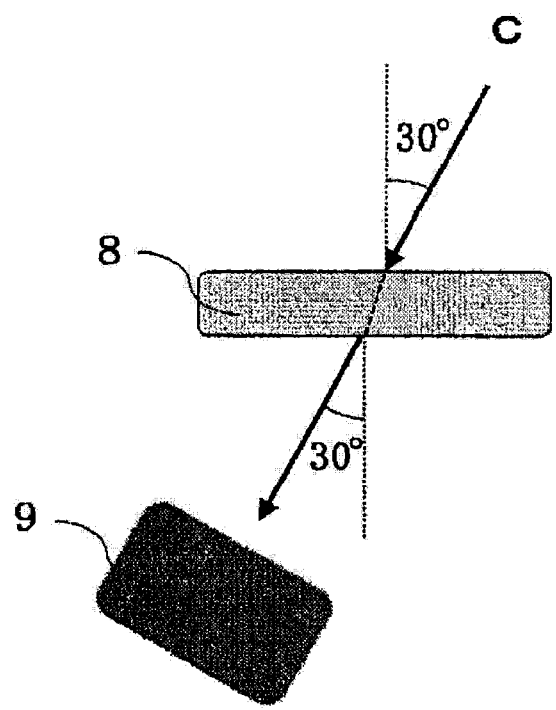
FIG. 4 is a schematic view showing a method of measuring the transmittance of a solid-state image capture element optical filter at an angle of 30° with respect to the vertical direction.

Here, as shown in FIG. 3, the transmittance of an optical filter in the vertical direction was determined by measuring the light transmitting through an optical filter perpendicularly thereto. Further, as shown in FIG. 4, the transmittance of an optical filter at an angle of 30° with respect to the vertical direction was determined by measuring the light transmitting through the optical filter 8 at an angle of 30° with respect to the vertical direction.

It is noted here that, except for the maximum value (U), other spectral transmittance values were measured using the above-described spectrophotometer under a condition in which the incidence angle of incoming light was perpendicular to the subject substrate and optical filter.

Synthesis Examples

Those compounds (X), compounds (Y) and other dyes (Z) that were used in the below-described examples can be synthesized by a commonly known method, examples of which include the methods described in Japanese Patent No. 3366697, Japanese Patent No. 2846091, Japanese Patent No. 2864475, Japanese Patent No. 3703869, JP-A-S60-228448, JP-A-H1-146846, JP-A-H1-228960, Japanese Patent No. 4081149, JP-A-S63-124054, "Phthalocyanines-Chemistry and Functions-" (Industrial Publishing & Consulting, Inc., 1997), JP-A-2007-169315, JP-A-2009-108267, JP-A-2010-241873, Japanese Patent No. 3699464 and Japanese Patent No. 4740631.

Resin Synthesis Example 1

To a reaction vessel whose atmosphere had been replaced with nitrogen, 100 parts of 8-methyl-8-methoxycarbonyl tetracyclo[4.4.0.1$^{2,5}$.1$^{7,10}$]dodeca-3-ene represented by the following Formula (19) (hereinafter, also referred to as "DNM"), 18 parts of 1-hexene (molecular weight modifier) and 300 parts of toluene (solvent for ring-opening polymerization reaction) were loaded, and this solution was heated to 80° C. Then, to the solution in the reaction vessel, as polymerization catalysts, 0.2 parts of a toluene solution of triethyl aluminum (0.6 mol/L) and 0.9 parts of a toluene solution of methanol-modified tungsten hexachloride (concentration: 0.025 mol/L) were added, and the resulting solution was heated with stirring at 80° C. for 3 hours to perform a ring-opening polymerization reaction, thereby obtaining a ring-opened polymer solution. The polymerization conversion rate in this polymerization reaction was 97%.

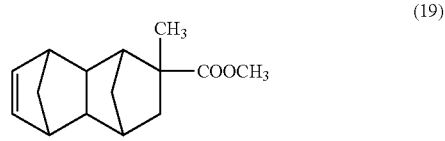 [SMILES: COC(=O)C1(C)CC2CC1C1C3C=CC(C3)C21]

(19)

Next, 1,000 parts of the thus obtained ring-opened polymer solution was loaded to an autoclave and 0.12 parts of RuHCl (CO) [P(C$_6$H$_5$)$_3$]$_3$ was added thereto. The resultant was heated with stirring for 3 hours at a hydrogen gas pressure of 100 kg/cm$^2$ and a reaction temperature of 165° C. to perform a hydrogenation reaction.

After cooling the thus obtained reaction solution (hydrogenated polymer solution), the pressure of the hydrogen gas was discharged. This reaction solution was poured into a large amount of methanol and the resulting precipitate was separated and recovered. This precipitate was then dried to obtain a hydrogenated polymer (hereinafter, also referred to as "resin A"). The thus obtained resin A had a number-average molecular weight (Mn) of 32,000, a weight-average molecular weight (Mw) of 137,000 and a glass transition temperature (Tg) of 165° C.

Resin Synthesis Example 2

To a 3-L four-necked flask, 35.12 g (0.253 mol) of 2,6-difluorobenzonitrile, 87.60 g (0.250 mol) of 9,9-bis(4-hydroxyphenyl) fluorene, 41.46 g (0.300 mol) of potassium carbonate, 443 g of N,N-dimethylacetamide (hereinafter, also referred to as "DMAc") and 111 g of toluene were added. Subsequently, the four-necked flask was fitted with a thermometer, a stirrer, a nitrogen-introducing tube-equipped three-way stopcock, a Dean-Stark tube and a cooling tube.

Then, after replacing the atmosphere in the flask with nitrogen, the thus obtained solution was allowed to react at 140° C. for 3 hours and generated water was removed from the Dean-Stark tube as needed. Once water was no longer generated, the temperature was slowly raised to 160° C. and the solution was allowed to react at this temperature for 6 hours.

After cooling the solution to room temperature (25° C.), generated salt was removed using a filter paper. The filtrate was then added to methanol for reprecipitation and the resulting precipitate (residue) was isolated by filtration. The thus obtained residue was vacuum-dried overnight at 60° C.

to obtain white powder (hereinafter, also referred to as "resin B") (yield: 95). The thus obtained resin B had a number-average molecular weight (Mn) of 75,000, a weight-average molecular weight (Mw) of 188,000 and a glass transition temperature (Tg) of 285° C.

Resin Synthesis Example 3

In a 500-mL five-necked flask equipped with a thermometer, a stirrer, a nitrogen-introducing tube, dropping funnel with a side tube, a Dean-Stark tube and a cooling tube, 10.0 parts by weight (0.05 mol) of 4,4'-diaminodiphenyl ether was dissolved in 85 parts by weight of N-methyl-2-pyrrolidone used as a solvent under nitrogen gas flow. Then, 11.2 parts by weight (0.05 mol) of 1,2,4,5-cyclohexanetetracarboxylic dianhydride in solid form was separately loaded at room temperature over a period of 1 hour, and the resultant was stirred at room temperature for 2 hours.

Subsequently, after adding 30.0 parts by weight of xylene as an azeotropic dehydration solvent and heating the resulting mixture to 180° C., the mixture was allowed to react for 3 hours and xylene was refluxed using the Dean-Stark tube to separate azeotroped water. After 3 hours, it was confirmed that distillation of water had been completed, and the temperature was raised to 190° C. over a period of 1 hour to distil of xylene, thereby recovering the resulting product in an amount of 29.0 parts by weight. Thereafter, the thus recovered product was air-cooled to an inner temperature of 60° C., thereby obtaining 105.4 parts by weight of a N-methyl-2-pyrrolidone solution of polyimide (hereinafter, referred to as "the polyimide solution C").

Example 1

In a container, 100 parts by weight of the resin A obtained in Resin Synthesis Example 1, 0.40 parts by weight of a triazine compound represented by the following Formula (20) (absorption maximum wavelength: about 355 to 365 nm), 0.05 parts by weight of a cyanine compound represented by the following Formula (21) (absorption maximum wavelength: about 680 to 690 nm) and methylene chloride were added to prepare a solution (ex1) having a resin concentration of 20% by weight.

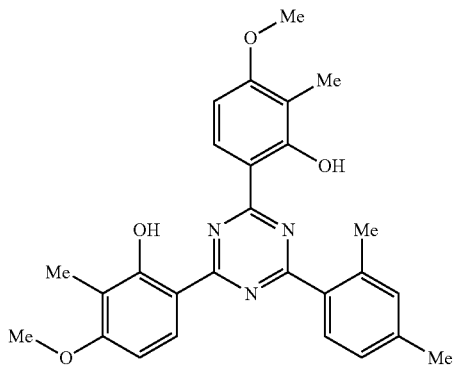

(20)

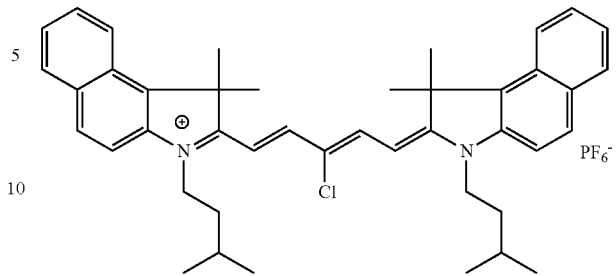

(21)

Then, the thus obtained solution (ex1) was cast on a smooth glass plate, dried at 20° C. for 8 hours and subsequently detached from the glass plate. This detached coating film was further dried under reduced pressure at 100° C. for 8 hours to obtain a resin substrate of 0.1 mm in thickness, 60 mm in length and 60 mm in width (hereinafter, also simply referred to as "the substrate").

Thereafter, on one side of the thus obtained substrate, a vapor-deposited multilayer film reflecting near-infrared ray [a film in which silica layers ($SiO_2$: layer thickness=83 to 199 nm) and titania layers ($TiO_2$: layer thickness=101 to 125 nm) were alternately stacked; number of stacked layers: 20] was formed at a vapor deposition temperature of 100° C., and on the other side of the substrate, a vapor-deposited multilayer film reflecting near-infrared ray [a film in which silica layers ($SiO_2$: layer thickness=77 to 189 nm) and titania layers ($TiO_2$: layer thickness=84 to 118 nm) were alternately stacked; number of stacked layers: 26] was further formed at a vapor deposition temperature of 100° C., thereby obtaining a 0.105 mm-thick optical filter.

The spectral transmittance of the thus obtained optical filter was measured to determine the transmittance in the visible wavelength region, the optical properties in the infrared wavelength region, and the maximum value (U). The results thereof are shown in Table 2.

Example 2

On one side of the substrate of 0.1 mm in thickness, 60 mm in length and 60 mm in width that was obtained in Example 1, a vapor-deposited multilayer film reflecting near-infrared ray [a film in which a silica layer ($SiO_2$: layer thickness=120 to 190 nm) and a titania layer ($TiO_2$: layer thickness=70 to 120 nm) were alternately stacked; number of stacked layers: 40] was formed to produce a 0.104 mm-thick optical filter, which was subsequently evaluated. The results thereof are shown in Table 2.

[Example 3] to [Example 23] and [Comparative Example 1] to [Comparative Example 2]

A 0.105 mm-thick optical filter was produced in the same manner as in Example 1, except that the resin, the solvent, the dye and the film drying condition were changed as shown in Table 1. The production conditions of each optical filter are shown in Table 1 and the evaluation results are shown in Table 2. In Table 1, all of the resins were added in an amount of 100 parts by weight; the resin concentration of each resin solution was 20% by weight in all of Examples and Comparative Examples except for Example 17; and the resin concentration of the resin solution of Example 17 was 18% by weight. The resins A to J, the solvents (1) to (4) and the dyes (20) to (28) that were used in Examples and Comparative Examples are shown below.

<Resins>

Resin A: the resin A obtained in Resin Synthesis Example 5

Resin B: the resin B obtained in Resin Synthesis Example

Resin C: the polyimide solution C obtained in Resin Synthesis Example 3

Resin D: cyclic olefin-based resin, "ZEONOR 1420R" manufactured by ZEON Corporation Resin E: cyclic olefin-based resin, "APEL #6015" manufactured by Mitsui Chemicals, Inc.

Resin F: polycarbonate resin, "PURE-ACE" manufactured by TEIJIN Ltd.

Resin G: polyether sulfone resin, "SUMILITE FS-1300" manufactured by Sumitomo Bakelite Co., Ltd.

Resin H: fluorene-based polyester resin, "OKP4" manufactured by Osaka Gas Chemicals Co., Ltd.

Resin I: acrylic resin, "ACRYVIEWA" manufactured by Nippon Shokubai Co., Ltd.

Resin J: polycarbonate resin, "YUPIZETA EP-5000" manufactured by Mitsubishi Gas Chemical Company, Inc.

<Solvents>

Solvent (1): methylene chloride

Solvent (2): N-methyl-2-pyrrolidone

Solvent (3): a mixed solution of cyclohexane and xylene (cyclohexane:xylene=7:3 (weight ratio))

Solvent (4): a mixed solution of cyclohexane and methylene chloride (cyclohexane:methylene chloride=99:1 (weight ratio))

<Dyes>

In Table 1, "(X)" means the compound (X); "(Y)" means the compound (Y); "(Z)" means the dye (Z); and "(Z')" means a dye other than (X) to (Z).

Dye (20): a triazine compound represented by the Formula (20) (absorption maximum wavelength: about 355 to 365 nm; the absorption maximum wavelength is variable depending on the solvent and matrix resin; the same applies below)

Dye (21): a cyanine compound represented by the Formula (21) (absorption maximum wavelength: about 680 to 690 nm)

Dye (22): an azomethine compound represented by the following Formula (22) (absorption maximum wavelength: about 375 to 385 nm)

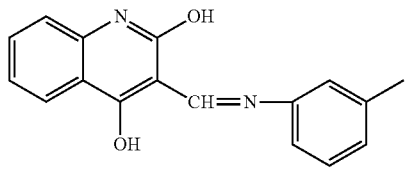

(22)

Dye (23): an indole compound represented by the following Formula (23) (absorption maximum wavelength: about 385 to 395 nm)

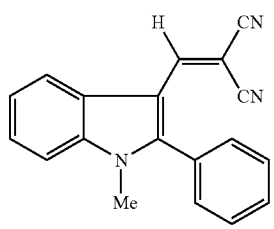

(23)

Dye (24): a squarylium compound represented by the following Formula (24) (absorption maximum wavelength: about 690 to 705 nm)

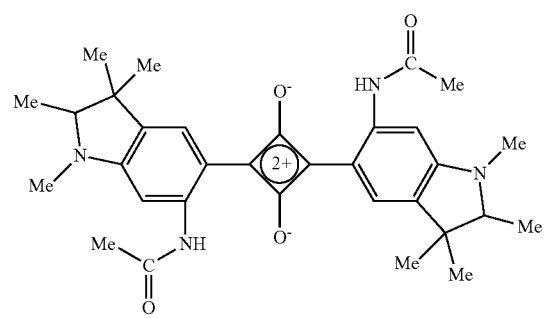

(24)

Dye (25): a benzotriazole compound represented by the following Formula (25) (absorption maximum wavelength: about 340 to 355 nm)

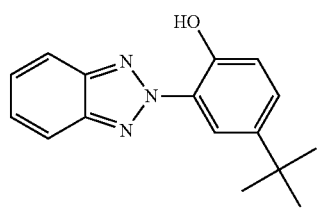

(25)

Dye (26): a phthalocyanine compound represented by the following Formula (26) (absorption maximum wavelength: about 695 to 710 nm)

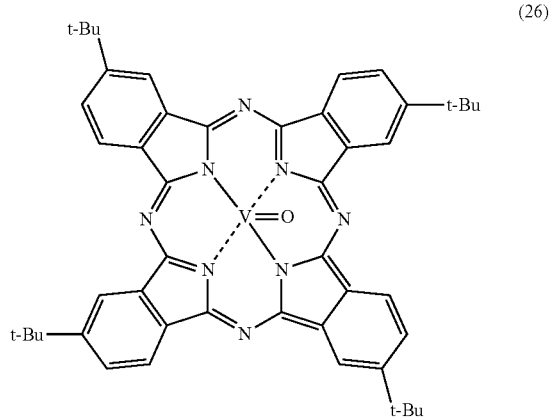

(26)

Dye (27): a diimonium compound represented by the following Formula (27) (absorption maximum wavelength: about 1,040 to 1,060 nm)

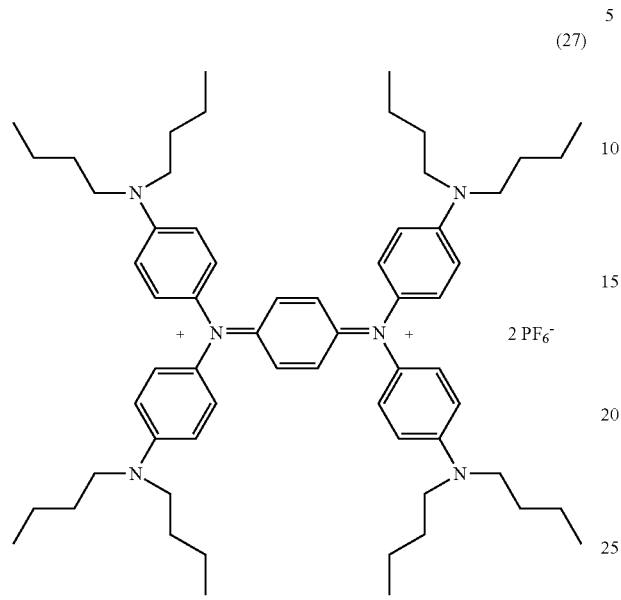

Dye (28): a cyanine-based visible light-absorbing dye represented by the following Formula (28) (absorption maximum wavelength: about 480 to 490 nm)

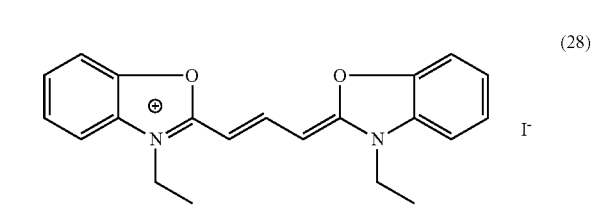

Further, the film drying conditions shown in Table 1 that were used in Examples and Comparative Examples are as follows.

Condition (1): 20° C./8 hr→under reduced pressure, 100° C./8 hr

Condition (2): 60° C./4 hr→80° C./4 hr→under reduced pressure, 120° C./8 hr

Condition (3): 60° C./8 hr→80° C./8 hr→under reduced pressure, 100° C./24 hr

Condition (4): 40° C./4 hr→60° C./4 hr→under reduced pressure, 100° C./8 hr

TABLE 1

| | | | Constitution of resin solution | | | | Film drying condition | Near infrared-reflecting film |
|---|---|---|---|---|---|---|---|---|
| | | | Dye [type, parts by weight] | | | | | |
| | Resin | Solvent | (X) | (Y) | (Z) | (Z') | | |
| Example 1 | A | (1) | (20), 0.40 | (21), 0.05 | | | (1) | both sides |
| Example 2 | A | (1) | (20), 0.40 | (21), 0.05 | | | (1) | one side |
| Example 3 | A | (1) | (22), 0.50 | (21), 0.05 | | | (1) | both sides |
| Example 4 | A | (1) | (20), 0.40 (23), 0.10 | (24), 0.04 | | | (1) | both sides |
| Example 5 | A | (1) | (23), 0.10 (25), 0.40 | (26), 0.07 | | | (1) | both sides |
| Example 6 | A | (1) | (23), 0.10 | (21), 0.05 | (27), 0.10 | | (1) | both sides |
| Example 7 | A | (1) | (22), 0.50 | (24), 0.04 | (27), 0.10 | | (1) | both sides |
| Example 8 | A | (1) | (20), 0.40 (23), 0.10 | (26), 0.07 | (27), 0.10 | | (1) | both sides |
| Example 9 | A | (1) | (20), 0.40 (23), 0.10 | (24), 0.03 (26), 0.03 | | | (1) | both sides |
| Example 10 | A | (1) | (23), 0.10 (25), 0.40 | (24), 0.03 (26), 0.03 | | | (1) | both sides |
| Example 11 | A | (1) | (22), 0.40 (25), 0.40 | (24), 0.03 (26), 0.03 | | | (1) | both sides |
| Example 12 | B | (1) | (20), 0.40 | (21), 0.05 | | | (1) | both sides |
| Example 13 | B | (1) | (20), 0.40 | (24), 0.03 (26), 0.03 | | | (1) | both sides |
| Example 14 | B | (1) | (20), 0.40 (23), 0.10 | (24), 0.03 (26), 0.03 | | | (1) | both sides |
| Example 15 | B | (1) | (20), 0.40 (22), 0.40 | (24), 0.03 (26), 0.03 | | | (1) | both sides |
| Example 16 | C | (2) | (20), 0.40 | (24), 0.03 (26), 0.03 | | | (2) | both sides |
| Example 17 | D | (3) | (20), 0.40 | (24), 0.03 (26), 0.03 | | | (2) | both sides |
| Example 18 | E | (4) | (20), 0.40 | (24), 0.03 (26), 0.03 | | | (3) | both sides |
| Example 19 | F | (1) | (20), 0.40 | (24), 0.03 (26), 0.03 | | | (1) | both sides |
| Example 20 | G | (2) | (20), 0.40 | (24), 0.03 (26), 0.03 | | | (2) | both sides |
| Example 21 | H | (1) | (20), 0.40 | (24), 0.03 (26), 0.03 | | | (1) | both sides |

TABLE 1-continued

| | Resin | Solvent | Dye [type, parts by weight] (X) | (Y) | (Z) | (Z') | Film drying condition | Near infrared-reflecting film |
|---|---|---|---|---|---|---|---|---|
| Example 22 | I | (1) | (20), 0.40 | (24), 0.03<br>(26), 0.03 | | | (1) | both sides |
| Example 23 | J | (1) | (20), 0.40 | (24), 0.03<br>(26), 0.03 | | | (1) | both sides |
| Comparative Example 1 | A | (1) | | | | | (1) | both sides |
| Comparative Example 2 | A | (1) | | | | (28), 0.04 | (1) | both sides |

TABLE 2

| | Optical filter | | |
|---|---|---|---|
| | Average transmittance in a wavelength range of 430 nm to 580 nm | Average transmittance in a wavelength range of 800 nm to 1,000 nm | (U) |
| Example 1 | 89% | 1% or less | 12% |
| Example 2 | 89% | 1% or less | 11% |
| Example 3 | 91% | 1% or less | 11% |
| Example 4 | 91% | 1% or less | 10% |
| Example 5 | 89% | 1% or less | 11% |
| Example 6 | 84% | 0.5% or less | 11% |
| Example 7 | 85% | 0.5% or less | 10% |
| Example 8 | 85% | 0.5% or less | 10% |
| Example 9 | 91% | 1% or less | 10% |
| Example 10 | 90% | 1% or less | 11% |
| Example 11 | 90% | 1% or less | 10% |
| Example 12 | 87% | 1% or less | 12% |
| Example 13 | 88% | 1% or less | 11% |
| Example 14 | 87% | 1% or less | 10% |
| Example 15 | 87% | 1% or less | 11% |
| Example 16 | 86% | 1% or less | 11% |
| Example 17 | 90% | 1% or less | 12% |
| Example 18 | 89% | 1% or less | 12% |
| Example 19 | 87% | 1% or less | 11% |
| Example 20 | 87% | 1% or less | 11% |
| Example 21 | 87% | 1% or less | 12% |
| Example 22 | 91% | 1% or less | 12% |
| Example 23 | 91% | 1% or less | 11% |
| Comparative Example 1 | 92% | 1% or less | 38% |
| Comparative Example 2 | 54% | 1% or less | 36% |

INDUSTRIAL APPLICABILITY

The solid-state image capture element optical filter of the present invention can be suitably used in digital still cameras, cell phone cameras, digital video camcorders, PC cameras, surveillance cameras, vehicle onboard cameras, televisions, car navigation systems, personal digital assistant devices, personal computers, video game consoles, portable game consoles, fingerprint recognition systems, digital music players and the like.

DESCRIPTION OF SYMBOLS

1: camera module
2: lens barrel
3: flexible substrate
4: hollow package
5: lens
6: optical filter (for solid-state image capturing element)
6': solid-state image capture element optical filter of the present invention
7: (CCD or CMOS) image sensor
8: optical filter
9: spectrophotometer
10: transmittance measured in the vertical direction (0°)
11: transmittance measured at an angle of 30° with respect to the vertical direction
12: wavelength (H)
13: wavelength region of ±20 nm from wavelength (H)
14: maximum value (U)
A: near-ultraviolet light
B: light reflected from the lens
C: light

The invention claimed is:

1. A solid-state image capture element optical filter, comprising:
a transparent resin substrate which comprises a compound (X) having an absorption maximum in a wavelength range of 300 to 420 nm and a compound (Y) having an absorption maximum in a wavelength range of 600 to 800 nm; and
a near infrared-reflecting film on at least one side of said substrate;
wherein
an average transmittance in a wavelength range of 800 nm to 1,000 nm is at most 1%,
wherein the average transmittance in the wavelength range of 800 nm to 1,000 nm is measured under a condition that an incidence angle of incoming light is perpendicular to the optical filter.

2. The solid-state image capture element optical filter according to claim 1, wherein said compound (X) is at least one selected from the group consisting of azomethine-based compounds, indole-based compounds, benzotriazole-based compounds and triazine-based compounds.

3. The solid-state image capture element optical filter according to claim 1, wherein a maximum absolute value (U) of a difference between the transmittance in the vertical direction in a wavelength region of ±20 nm from a wavelength (H) at which the transmission of the optical filter is 50% in a wavelength region of 300 to 450 nm and a transmittance at 30° with respect to the vertical direction in the same wavelength region is less than 25%.

4. A solid-state imaging device, comprising the solid-state image capture element optical filter according to claim 1.

5. A camera module, comprising the solid-state image capture element optical filter according to claim 1.

6. The solid-state image capture element optical filter according to claim 1, wherein an average transmittance in a wavelength range of 430 nm to 580 nm is 84% to 91%, wherein the average transmittance in the wavelength range of 430 nm to 580 nm is measured under a condition that an incidence angle of incoming light is perpendicular to the optical filter.

* * * * *